(12) United States Patent
Kim et al.

(10) Patent No.: US 8,957,690 B2
(45) Date of Patent: Feb. 17, 2015

(54) MICRO CONTACT PROBE COATED WITH NANOSTRUCTURE AND METHOD FOR MANUFACTURING THE SAME

(75) Inventors: Jung-Yup Kim, Daejeon (KR); Hak-Joo Lee, Daejeon (KR); Chang-Soo Han, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 533 days.

(21) Appl. No.: 13/119,590

(22) PCT Filed: Feb. 19, 2009

(86) PCT No.: PCT/KR2009/000796
§ 371 (c)(1),
(2), (4) Date: Mar. 17, 2011

(87) PCT Pub. No.: WO2010/032905
PCT Pub. Date: Mar. 25, 2010

(65) Prior Publication Data
US 2011/0163772 A1    Jul. 7, 2011

(30) Foreign Application Priority Data
Sep. 17, 2008    (KR) ........................ 10-2008-0091148

(51) Int. Cl.
G01R 1/067        (2006.01)
G01R 3/00         (2006.01)
(52) U.S. Cl.
CPC .............. *G01R 3/00* (2013.01); *G01R 1/06744* (2013.01); *G01R 1/06727* (2013.01); *Y10S 977/742* (2013.01)
USPC .................. 324/754.03; 324/755.01; 977/742

(58) Field of Classification Search
None
See application file for complete search history.

(56) References Cited

U.S. PATENT DOCUMENTS

| 5,383,354 | A  | * | 1/1995 | Doris et al. | ...................... 73/105 |
| 7,082,683 | B2 | * | 8/2006 | Han et al. | ........................ 29/874 |
| 2003/0102222 | A1 | * | 6/2003 | Zhou et al. | ..................... 205/109 |
| 2005/0202578 | A1 | * | 9/2005 | Yaniv et al. | ..................... 438/20 |

(Continued)

FOREIGN PATENT DOCUMENTS

| KR | 10-2005-0056024 A | 6/2005 |
| KR | 10-2007-0072222 A | 7/2007 |

(Continued)

OTHER PUBLICATIONS

Obraztsov, A.N. et al., "Chemical vapor deposition of thin graphite films of nanometer thickness" Jun. 2007, Carbon, 45, pp. 2017-2021.*

(Continued)

*Primary Examiner* — Melissa Koval
*Assistant Examiner* — Stephen G Armstrong
(74) *Attorney, Agent, or Firm* — Pearl Cohen Zedek Latzer Baratz LLP

(57) ABSTRACT

The present invention relates to a micro contact probe used for a probe card. An exemplary embodiment of the present invention provides a micro contact probe including a coating layer of a nanostructure such as carbon nanotubes formed on a surface thereof to reduce contact resistance when contacting a semiconductor chip. According to the micro contact probe of which the surface is coated with the nanostructure, contact resistance between the probe and the semiconductor chip is lowered and the high frequency characteristics are improved, such that a more accurate measurement can be obtained.

5 Claims, 2 Drawing Sheets

(56) References Cited

U.S. PATENT DOCUMENTS

| | | |
|---|---|---|
| 2006/0113469 A1* | 6/2006 | Baba et al. .................... 250/310 |
| 2008/0000293 A1* | 1/2008 | Kitazawa et al. ............... 73/105 |
| 2008/0140195 A1 | 6/2008 | Su et al. |
| 2010/0112828 A1* | 5/2010 | Eldridge et al. ................ 439/66 |

FOREIGN PATENT DOCUMENTS

| | | |
|---|---|---|
| KR | 10-2008-0090158 A | 10/2008 |
| WO | WO 2007011076 A1 * | 1/2007 |

OTHER PUBLICATIONS

Machine English translation of Korean Patent Application Publication to Inventors Chang Soo Han et al., KR 1020080090158 A, Oct. 8, 2008. Translation description created on Apr. 19, 2014.*

Internation Search Report, issued Sep. 3, 2009, for PCT International Application No. PCT/KR2009/000796.

* cited by examiner

MICRO CONTACT PROBE COATED WITH NANOSTRUCTURE AND METHOD FOR MANUFACTURING THE SAME

CROSS-REFERENCE TO RELATED APPLICATIONS

This application is a National Phase Application of PCT International Application No. PCT/KR2009/000796, International Filing Date Feb. 19, 2009, claiming priority of Korean Patent Application No. 10-2008-0091148, filed Sep. 17, 2008, both of which are incorporated by reference herein.

FIELD OF INVENTION

The present invention relates to a micro contact probe used for a probe card, and more particularly, to a micro contact probe for performing an electrical inspection of a semiconductor chip.

BACKGROUND OF INVENTION

Semiconductor chips have become highly integrated with recent technological developments. Generally, a manufactured semiconductor chip is subjected to an electrical inspection before being packaged, and properly functioning products are packaged according to the inspection results and defective products are discarded. When performing the electrical inspection, a probe card that electrically connects between a tester having a measurement device provided therein and a pad of the semiconductor chip has been used.

The probe attached to and used with the probe card may be largely classified into a cantilever-type probe, a membrane-type probe, a vertical-type probe, etc. In order to overcome the height difference between pads, these probes should have a structure that is capable of absorbing vertical displacement while having a structure that is capable of scrubbing to remove a native oxide present on an electrode surface.

In addition, the probes should have characteristics of low contact resistance in order to smoothly conduct current when the probe contacts the semiconductor chip while having the above-mentioned structures.

A probe used for a probe card mechanically contacts the electrical pad of the device to be inspected, and the contact resistance between the probe and the pad should be small. The contact resistance has been affected by the characteristics at a contact surface when the probe contacts the pad. Generally, in the case of an aluminum pad that has been frequently used, even though the surface of the aluminum pad is cleaned to remove foreign materials, the characteristics of the contact resistance are not good due to the native oxide. Therefore, in order to improve the characteristics of the contact resistance, the contact resistance of the probe according to the related art is sufficiently lowered when the native oxide is removed. In addition, in order to accurately analyze the characteristics of the chip to be measured, good high frequency characteristics should be implemented.

In the related art, in order to improve the characteristics of the probe, the probe is manufactured by a method of mixing carbon nanotubes as one of various materials for manufacturing the probe, a method of burying a conductive material made of conductive diamond or a nanoscale metal in a tip of the probe, etc.

However, the methods according to the related art use an excessively large amount of inexpensive carbon nanotubes in order to sufficiently satisfy the characteristics of the probe, or it is difficult to manufacture the probe.

SUMMARY OF THE INVENTION

The present invention has been made in an effort to provide a micro contact probe of which the surface is coated with a nanostructure such as carbon nanotubes in order to lower contact resistance between a probe and a semiconductor chip, and improve high frequency characteristics.

An exemplary embodiment of the present invention provides a micro contact probe for performing an electrical inspection on a semiconductor chip, wherein the micro contact probe includes a coating layer of a nanostructure formed on the surface thereof to reduce contact resistance when contacting the semiconductor chip and to improve high frequency characteristics.

The coating layer may be formed over the entire external surface of the micro contact probe or may be formed at only a tip portion contacting the semiconductor chip.

The coating layer may be affected by an electric field to have an aligned pattern.

The nano-structure may be made of a material selected from a group consisting of carbon nanotubes, carbon nano-fiber, a graphene sheet, and a mixture thereof.

The carbon nanotubes may be selected from single walled carbon nanotubes, multi-walled carbon nanotubes, and a mixture thereof.

Another exemplary embodiment of the present invention provides a method for manufacturing a micro contact probe for performing an electrical inspection on a semiconductor chip, the method including: preparing the micro contact probe; and coating a nanostructure on a surface of the micro contact probe, wherein contact resistance is reduced when the micro contact probe contacts the semiconductor chip, and high frequency characteristics are improved.

The coating may include coating the nanostructure by inkjet printing to coat the nanostructure over the external surface of the micro contact probe.

Further, the coating may include coating the nanostructure using DC electrophoresis to coat the nanostructure over the external surface of the micro contact probe.

The coating may include: preparing a solvent in which carbon nanotubes are dispersed; dipping a probe to be coated and a relative electrode in the solvent; collecting the carbon nanotubes at a tip portion of the probe by forming an AC electric field on the probe; and evaporating a liquid component of the solvent.

As described above, the exemplary embodiment of the present invention provides the micro contact probe of which the surface is coated with the nanostructure such as carbon nanotubes, etc., thereby making it possible to lower contact resistance between the probe and the semiconductor chip and improve the high frequency characteristics.

Further, in the probe of which the surface is coated with the carbon nanotubes, the surface of the probe is rough due to the coated carbon nanotubes, thereby making it possible to penetrate and remove a native oxide present on the semiconductor chip, that is, the electrical pad, by only using a small force of the probe.

Furthermore, when only the portion contacting the electrical pad of the probe according to the exemplary embodiment of the present invention is coated with the carbon nanotubes, the characteristics of the contact resistance can be improved at a low cost.

In addition, since the high frequency characteristics of the carbon nanotube are better than the high frequency characteristics of a general probe material, the high frequency characteristics of the probe can be remarkably improved when the entire probe is coated with the carbon nanotubes according to the present invention.

In addition, since the probe according to the exemplary embodiment of the present invention is manufactured by coating the external surface of the probe with the carbon nanotubes, the manufacturing method thereof is simple, and since only a minimal amount of carbon nanotubes is used in order to improve the mechanical characteristics and the electrical characteristics of the probe, the price is low.

DETAILED DESCRIPTION OF DRAWINGS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
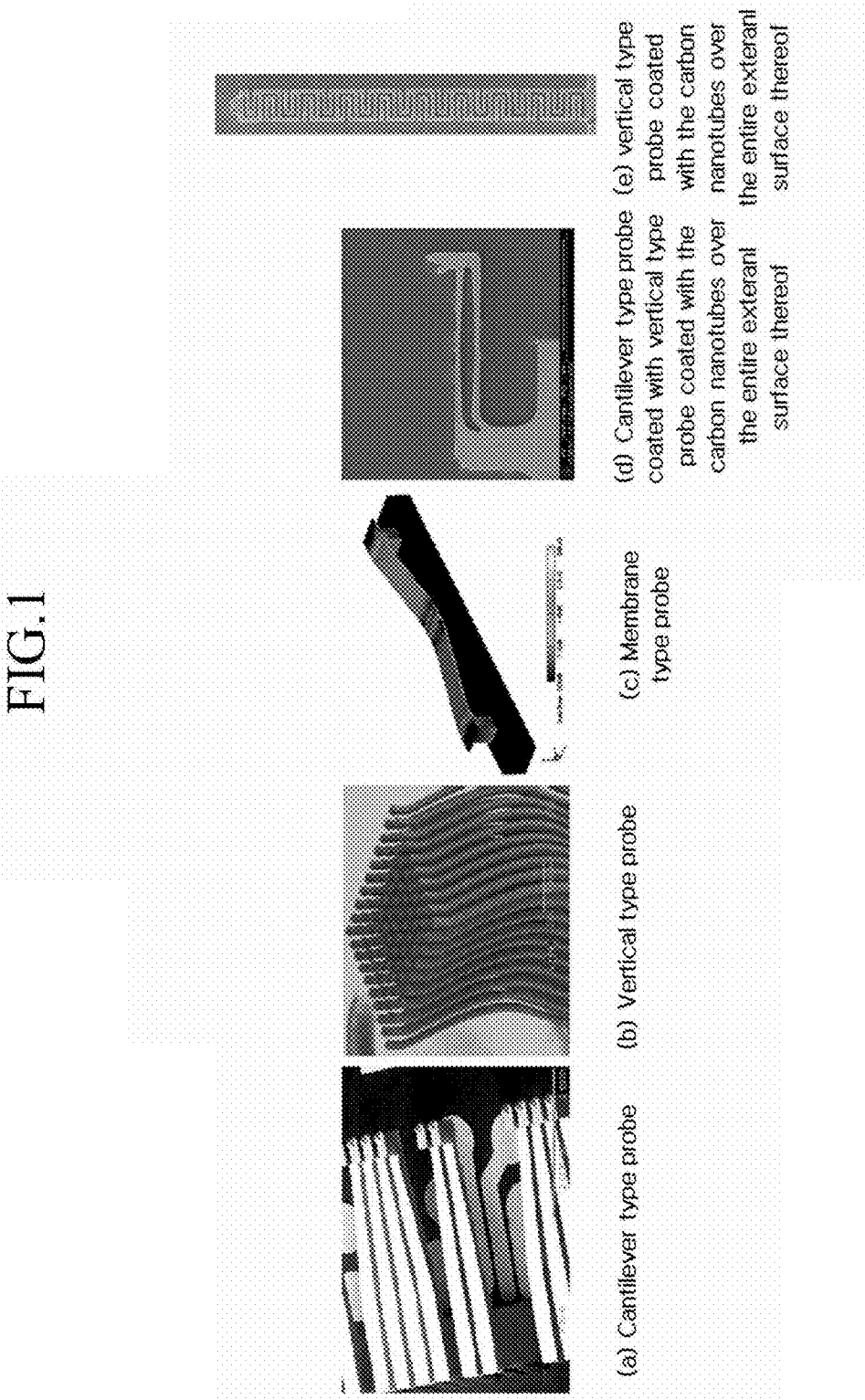
FIG. 1 is a diagram showing various examples of a micro contact probe coated with carbon nanotubes according to an exemplary embodiment of the present invention.

A micro contact probe according to an exemplary embodiment of the present invention is attached to a probe card, and may be used for performing an electrical inspection on a semiconductor chip. As shown in FIG. 1, the probe attached to and used with the probe card may be largely classified into a cantilever-type probe, a vertical-type probe, a membrane-type probe, etc., and the present invention may be applied to any of various types of probes.

According to the exemplary embodiment of the present invention, the micro contact probe is coated and processed with a nanostructure, for example carbon nanotubes, so that contact resistance of the micro contact probe performing the electrical inspection by contacting the semiconductor chip may be reduced.

In order to coat the probe with the carbon nanotubes according to the exemplary embodiment of the present invention, electrophoresis, dielectrophoresis, etc., are used. The entire external surface of the probe or a portion of the probe thereof may be coated with the carbon nanotubes by using electrophoresis.

The carbon nanotubes may be coated over the outer surface of the probe, or may be coated on only a tip portion that is a portion substantially contacting the semiconductor chip at the external surface of the probe.

In more detail, in order to coat the entire external surface of the probe, the carbon nanotubes are printed with an inkjet method, or as described above, the coating may be performed using a DC electric field similar to DC electrophoresis.

Figure 2:
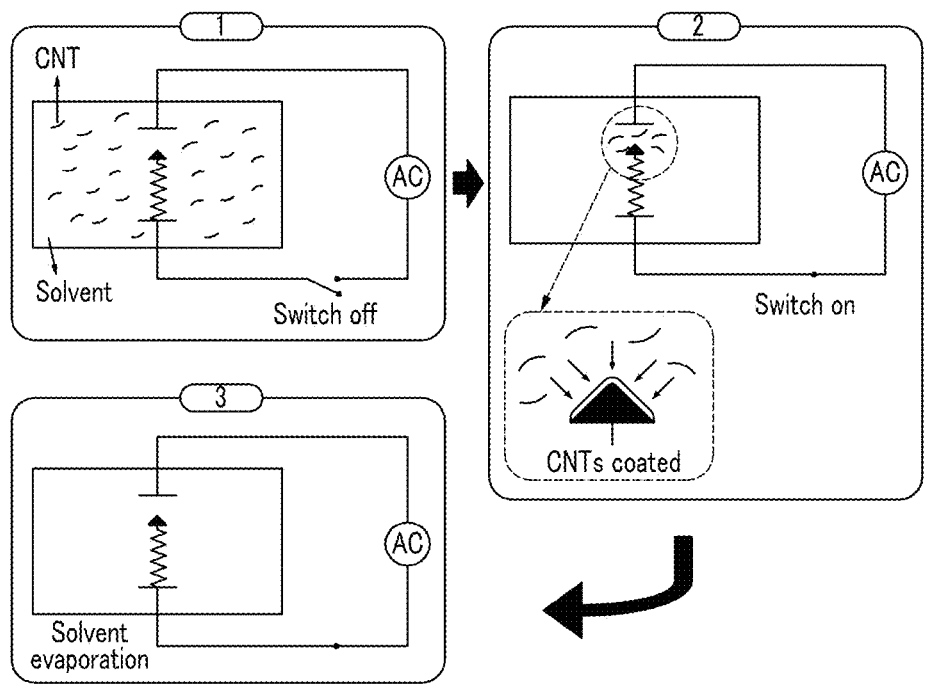
FIG. 2 is a flow chart for schematically explaining a method of coating a tip portion of the probe with the carbon nanotubes according to the exemplary embodiment of the present invention.

In addition, in order to coat a portion of the probe, for example only the tip portion, as shown in FIG. 2, a method of applying an AC electric field to only the tip portion to be coated by using dielectrophoresis to collect the carbon nanotubes in a solvent to the tip portion having a strong electric field, and then perform the coating by evaporating the solvent, may be used.

Describing with reference to FIG. 2, the method of coating the tip portion of the probe using dielectrophoresis is as follows.

First, a solvent in which the carbon nanotubes are dispersed is prepared, the probe to be coated is dipped in the solvent, and then a relative electrode for applying an electric field is dipped therein. Next, an AC electric field is formed in the probe to collect the carbon nanotubes at the tip portion of the probe. Finally, the coating of the tip portion of the probe is completed by evaporating a liquid component of the solvent.

The type of carbon nanotubes is classified as single walled carbon nanotubes and multi-walled carbon nanotubes. The carbon nanotubes used for coating the probe according to the exemplary embodiment of the present invention may be the single walled carbon nanotubes or the multi-walled carbon nanotubes. In addition, the single walled carbon nanotubes and the multi-walled carbon nanotubes may be used together.

In this case, the carbon nanotubes include nano-fiber having of a carbon-based hollow nanotube type. Further, a graphene sheet having crystallinity similar to the nanotubes may also be included in a material for the present invention, as well as carbon nano-fiber. The carbon nano-fiber and the graphene sheet may also be used together with the single walled carbon nanotubes, the multi-walled carbon nanotubes, etc. described above.

According to the exemplary embodiment of the present invention, the carbon nanotubes coated on the probe may be manufactured by chemical vapor deposition, electrical plating, arc discharge, laser techniques, or the like. In addition, carbon nanotubes manufactured by any other methods that may manufacture carbon nanotubes may also be used by being coated on the probe according to the exemplary embodiment of the present invention.

Further, the carbon nanotubes coated on the surface of the probe may be coated to have a regular or an irregular pattern.

For example, in the case of the above-mentioned dielectrophoresis, a regular pattern results due to the influence of the electric field, and in the case of the inkjet printing method or the DC electrophoresis method, an irregular pattern results. When the carbon nanotubes are coated to have a regular pattern on the surface of the probe, it may be more advantageous in terms of contact resistance or frequency characteristics.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A micro contact probe configured for use with a probe card for performing an electrical inspection on a semiconductor chip, wherein
the micro contact probe includes a coating layer of carbon nanotubes formed over the entire external surface thereof, said layer of carbon nanotubes reducing contact resistance when contacting the semiconductor chip and improving high frequency characteristics.

2. The micro contact probe of claim 1, wherein the carbon nanotubes are selected from single walled carbon nanotubes, multi-walled carbon nanotubes, and a mixture thereof.

3. A method for manufacturing a micro contact probe configurd for use with a probe card for performing an electrical inspection on a semiconductor chip, the method comprising:
preparing the micro contact probe; and coating carbon nanotubes over the entire external surface of the micro contact probe by inkjet printing;

wherein said carbon nanotubes reduce contact resistance when the micro contact probe contacts the semiconductor chip, and improve high frequency characteristacs.

4. A method for manufacturing a micro contact probe configured for use with a probe card for performing an electrical inspection on a semiconductor chip, the method comprising:

preparing the micro contact probe; and coating carbon nanotubes over the entire external surface of the micro contact probe using DC electrophoresis;

wherein said carbon nanotubes reduce contact resistance when the micro contact probe contacts the semiconductor chip, and improve high frequency characteristacs.

5. A micro contact probe configured for use with a probe card for performing an elecrical inspection on a semiconductor chip, wherien the micro contact probe comprises a coating layer of a single graphene sheet formed over the entire external surface thereof, said single graphene sheet reducing contact resistance when contacting the semiconductor chip improving high frequency characteristics.

* * * * *